United States Patent [19]
Kuo et al.

[11] Patent Number: 5,700,728
[45] Date of Patent: Dec. 23, 1997

[54] METHOD OF FORMING AN MNOS/MONOS BY EMPLOYING LARGE TILT ANGLE ION IMPLANTATION UNDERNEATH THE FIELD OXIDE

[75] Inventors: Ta-Chi Kuo, Hsin-chu; Jyh-Kuang Lin, I-Lan, both of Taiwan

[73] Assignee: United Microelectronics Corporation, Hsin-chu, Taiwan

[21] Appl. No.: 557,695

[22] Filed: Nov. 13, 1995

Related U.S. Application Data

[62] Division of Ser. No. 334,956, Nov. 7, 1994, abandoned.
[51] Int. Cl.⁶ .................................................. H01L 21/8238
[52] U.S. Cl. .......................... 438/216; 438/225; 438/525
[58] Field of Search ............................. 437/35, 28, 45, 437/52, 51, 43, 61, 69, 70

[56] References Cited

U.S. PATENT DOCUMENTS

| 5,073,514 | 12/1991 | Ito et al. | 437/44 |
| 5,147,811 | 9/1992 | Sakagami | 437/35 |
| 5,177,030 | 1/1993 | Lee et al. | 437/47 |
| 5,196,367 | 3/1993 | Lu et al. | 437/70 |
| 5,212,542 | 5/1993 | Okumura | 257/369 |
| 5,217,910 | 6/1993 | Shimizu et al. | 437/35 |
| 5,221,630 | 6/1993 | Royama et al. | 437/35 |
| 5,240,874 | 8/1993 | Roberts | 437/35 |
| 5,344,783 | 9/1994 | Nagalingam et al. | 437/35 |
| 5,360,749 | 11/1994 | Anjum et al. | 437/35 |
| 5,422,301 | 6/1995 | Otsuki | 437/45 |
| 5,432,107 | 7/1995 | Uno et al. | 437/45 |

FOREIGN PATENT DOCUMENTS

| 0048442 | 3/1991 | Japan . | |
| 0142732 | 5/1992 | Japan | 437/35 |
| 0036983 | 2/1993 | Japan . | |
| 0097276 | 4/1994 | Japan | 437/35 |
| 0120452 | 4/1994 | Japan | 437/35 |

Primary Examiner—Tuan H. Nguyen
Attorney, Agent, or Firm—William H. Wright

[57] ABSTRACT

A new method of forming an integrated circuit MNOS/MONOS device with suppressed off-cell leakage current is described. A silicon oxide layer is formed on the surface of a semiconductor substrate. A layer of silicon nitride is deposited over the silicon oxide layer and patterned. A first ion implantation is performed at a tilt angle to form channel stop regions in the semiconductor substrate not covered by the patterned silicon nitride layer wherein the channel stop regions partially extend underneath the patterned silicon nitride layer. The silicon substrate not covered by the patterned silicon nitride layer is oxidized to form field oxide regions within the silicon substrate wherein the channel stop regions extend under the full length of the field oxide regions. The patterned silicon nitride layer is removed. An insulating layer of silicon nitride/silicon oxide (NO) or silicon oxide/silicon nitride/silicon oxide (ONO) is deposited over the surface of the semiconductor substrate. A layer of polysilicon is deposited overlying the insulating layer and patterned. Source and drain regions are formed within the semiconductor substrate to complete the MNOS/MONOS device with constant threshold voltage in the fabrication of an integrated circuit.

18 Claims, 5 Drawing Sheets

METHOD OF FORMING AN MNOS/MONOS BY EMPLOYING LARGE TILT ANGLE ION IMPLANTATION UNDERNEATH THE FIELD OXIDE

This is a continuation of application Ser. No. 08/334,956, filed Nov. 7, 1994 and now abandoned.

BACKGROUND OF THE INVENTION (1) Field of the Invention

The invention relates to the fabrication of integrated circuit devices, and more particularly, to a method for reducing cell leakage current by using a large tilt angle ion implantation under field oxide in MNOS/MONOS integrated circuits.

(2) Description of the Prior Art

FIG. 1 illustrates the conventional method of field implant in the fabrication of a Metal Nitride Oxide Silicon (MNOS) or Metal Oxide Nitride Oxide Silicon (MONOS) device using no tilt or 7° tilt angle. There is illustrated a semiconductor substrate 10 covered by a silicon oxide layer 12 and a patterned silicon nitride layer 14 covered by photoresist 16. The ions 17 are implanted vertically; that is with no tilt or a 7° tilt. Channel-stop regions 21 result. It can be seen in FIG. 2, that after field oxidation regions 22 are formed, the channel-stop implants 21 do not extend under the bird's beak regions 23 of the field oxide.

FIG. 3 shows the insulator layer 32 and polysilicon layer 34 of the MNOS/MONOS device. Highly concentrated electrons 52 exist within the NO (silicon oxide/silicon nitride) or ONO (silicon oxide/silicon nitride/silicon oxide) insulator layer 32. During programming operation of the device, many electrons tunnel through the silicon oxide and inject into the silicon nitride layer. Most of the injected electrons are trapped within the silicon nitride. The number of tunneled electrons is strongly dependent upon the thickness of the silicon oxide. Thus, because of the thicker oxide in the field oxide regions 22, the portions of the layer 54 and 56 over the bird's beak of the field oxide regions have fewer electrons. This problem of unequal concentrations of electrons causes different threshold voltages over the width of the transistor. FIG. 4 is a circuit diagram of the active area of FIG. 3. Effectively, three transistors with different threshold voltages have been fabricated. The middle transistor 52, corresponding to the middle of the active area 52 in FIG. 3, has a threshold voltage greater than 5 volts. The two transistors corresponding to the edges of the active area, 54 and 56, have threshold voltages of 3 volts. Those skilled in the art will appreciate that the 3 and 5 volts figures are for reference purposes only. Other voltages can occur.

Large tilt-angle implanted drain (LATID) processes have been used by a number of workers in the art to form lightly doped drains (LDD). U.S. Pat. No. 5,073,514 to Ito et al discloses the formation of an LDD MOSFET using LATID to form the N− and then used vertical ion implantation to form the N+ region. U.S. Pat. No. 5,147,811 to Sakagami describes the formation of a P region under the gate using LATID and then a vertical ion implant to form the N+ source/drain regions. U.S. Pat. Nos. 5,177,030 to Lee et al, 5,212,542 to Okamura et al, 5,217,910 to Shimizu et al, and 5,221,630 to Koyama et al describe other methods of LATID.

SUMMARY OF THE INVENTION

A principal object of the present invention is to provide an effective and very manufacturable method of forming a MNOS/MONOS device with a constant threshold voltage.

Another object of the present invention is to provide a method of forming a MNOS/MONOS device which suppresses leakage current.

In accordance with the objects of this invention the method of forming an integrated circuit MNOS/MONOS device with suppressed off-cell leakage current is achieved. A silicon oxide layer is formed on the surface of a semiconductor substrate. A layer of silicon nitride is deposited over the silicon oxide layer and patterned. A first ion implantation is performed at a tilt angle to form channel stop regions in the semiconductor substrate not covered-by the patterned silicon nitride layer wherein the channel stop regions partially extend underneath the patterned silicon nitride layer. The silicon substrate not covered by the patterned silicon nitride layer is oxidized to form field oxide regions within the silicon substrate wherein the channel stop regions extend under the full length of the field oxide regions. The patterned silicon nitride layer is removed. An insulating layer of silicon nitride/silicon oxide (NO) or silicon oxide/silicon nitride/silicon oxide (ONO) is deposited over the surface of the semiconductor substrate. A layer of polysilicon is deposited overlying the insulating layer and patterned. Source and drain regions are formed within the semiconductor substrate to complete the MNOS/MONOS device with constant threshold voltage in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

FIGS. 5 through 9 illustrate an N channel MOSFET integrated circuit device. However, it is well understood by those skilled in the art that a P channel FET integrated circuit device could be formed by simply substituting opposite polarities to those given for the N channel embodiment. Also, in a similar way, a CMOSFET could be formed by making both N channel and P channel devices upon the same substrate.

Figure 1:
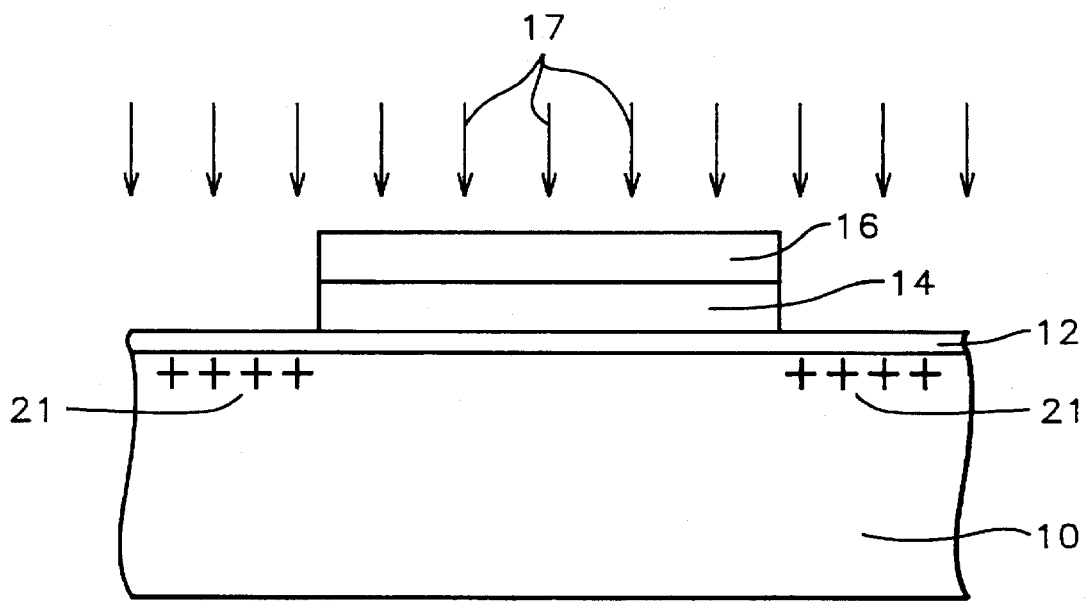
FIGS. 1 through 3 schematically illustrate in cross-sectional representation an integrated circuit of the prior art.
Figure 2:
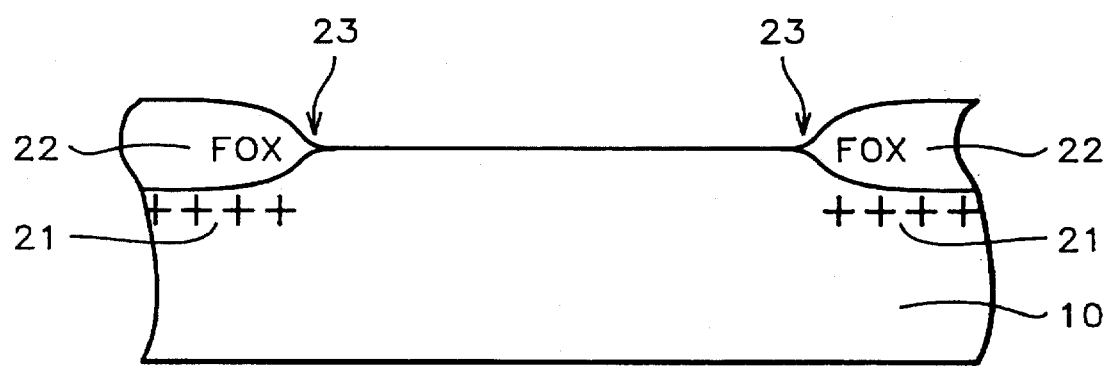
Figure 3:
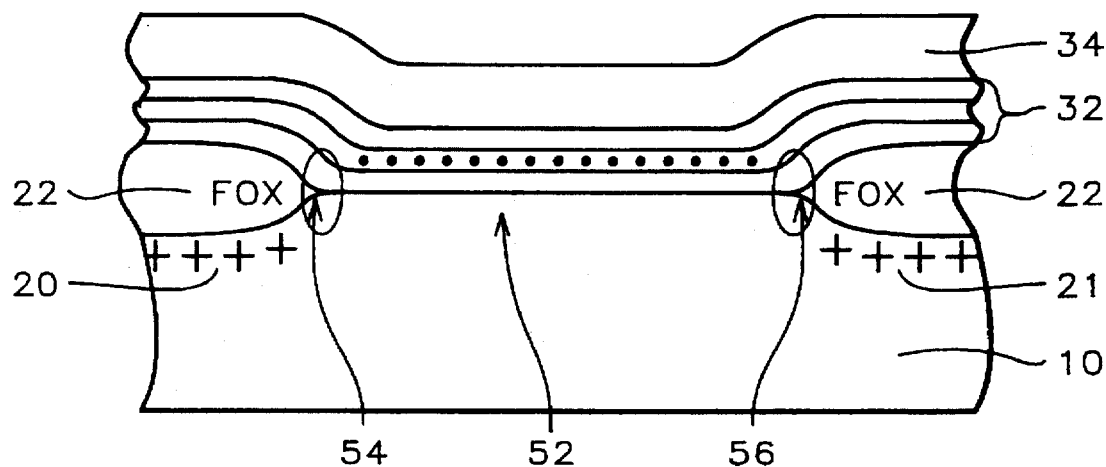
Figure 4:
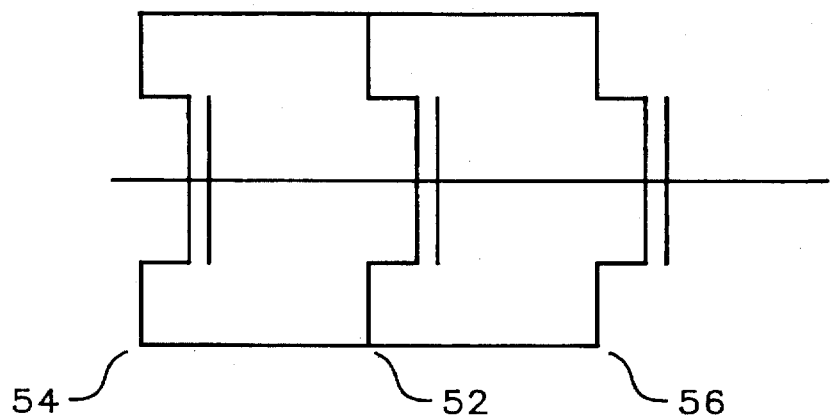
FIG. 4 schematically represents a circuit diagram of the prior art.
Figure 5:
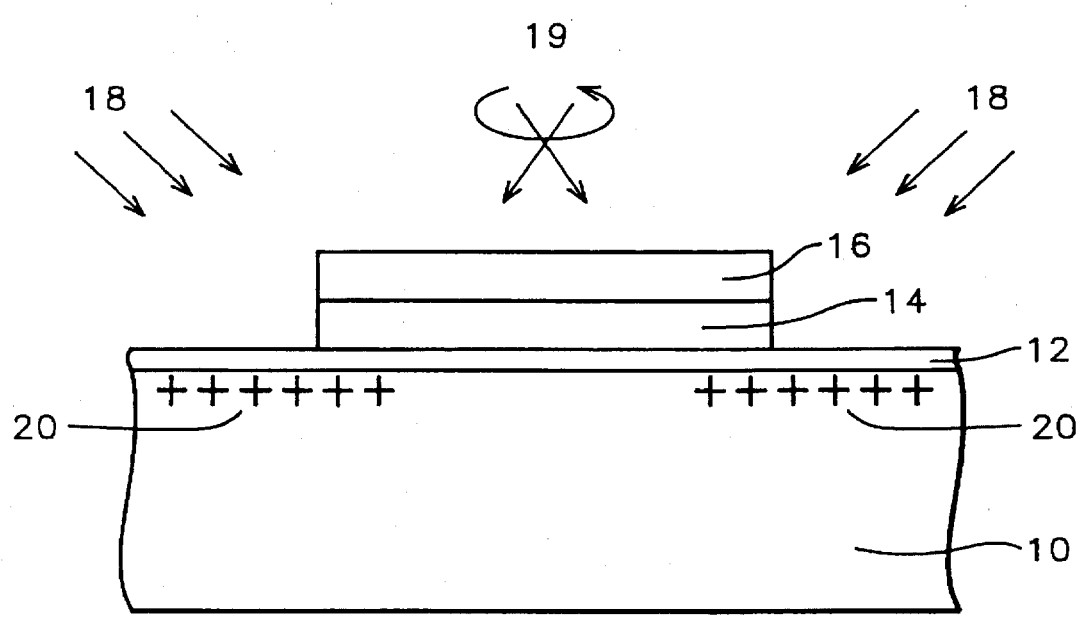
FIGS. 5 through 9 schematically represent in cross-sectional representation a preferred embodiment of the present invention.

Referring now more particularly to FIG. 5, there is shown an illustration of a portion of a partially completed integrated circuit in which there is a monocrystalline semiconductor substrate 10. The surface of the silicon substrate 10 is thermally oxidized to form a silicon oxide layer 12. This layer is between about 200 to 800 Angstroms in thickness.

A silicon nitride layer 14 is deposited by chemical vapor deposition (CVD) to a thickness of between about 800 to 2000 Angstroms. The layer 14 is coated with photoresist 16 which is patterned using conventional photolithography and etching techniques. The silicon nitride layer 14 is etched away where it is not covered by the photoresist mask. The photoresist layer 16 is removed.

The critical large tilt angle ion implantation process will now be described. $B_{11}$ or $BF_2$ ions 18 are implanted at an energy of between about 10 to 300 KeV and a dosage of between about 1 E 12 to 1 E 14 atoms/cm$^2$ with a tilt angle of more than about 10° and preferably between about 25° to 70°. This forms the channel-stop regions 20. 19 illustrates the rotation of the wafer during ion implantation. The wafer rotates to achieve a symmetrical implantation. The channel-stop regions 20 extend underneath the patterned silicon nitride layer 14.

Figure 6:
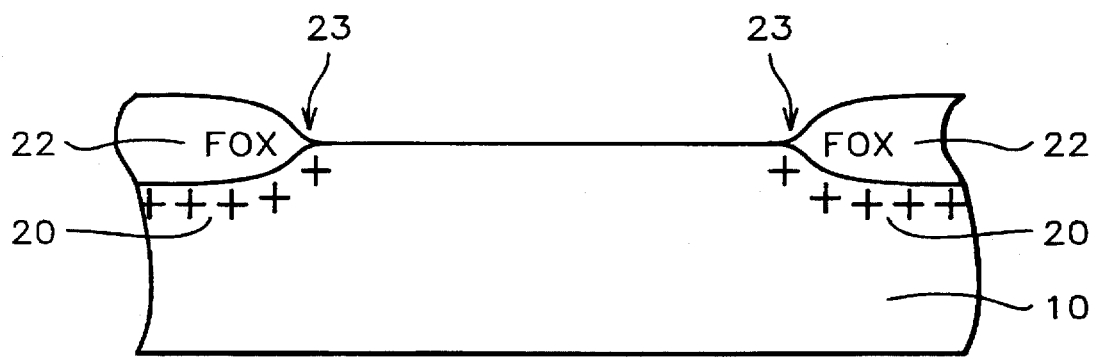

Referring now to FIG. 6, the portions of the silicon substrate not covered by the silicon nitride layer are oxidized to form field oxidation regions 22. The silicon nitride layer 14 is removed. It can be seen that the channel-stop implants 20 extend under the bird's beak regions 23.

Figure 7:
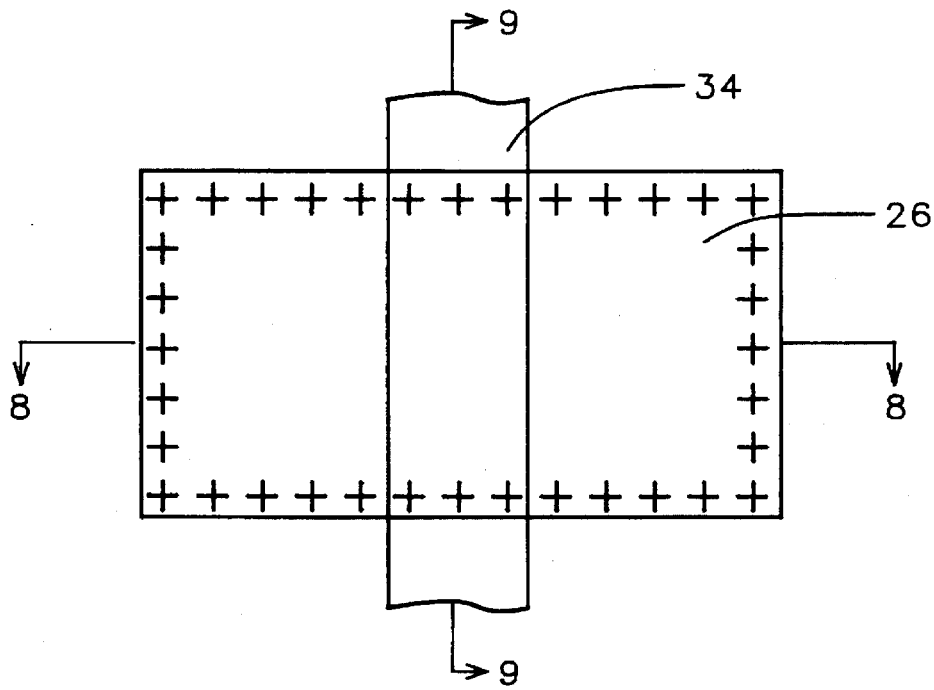
Figure 8:
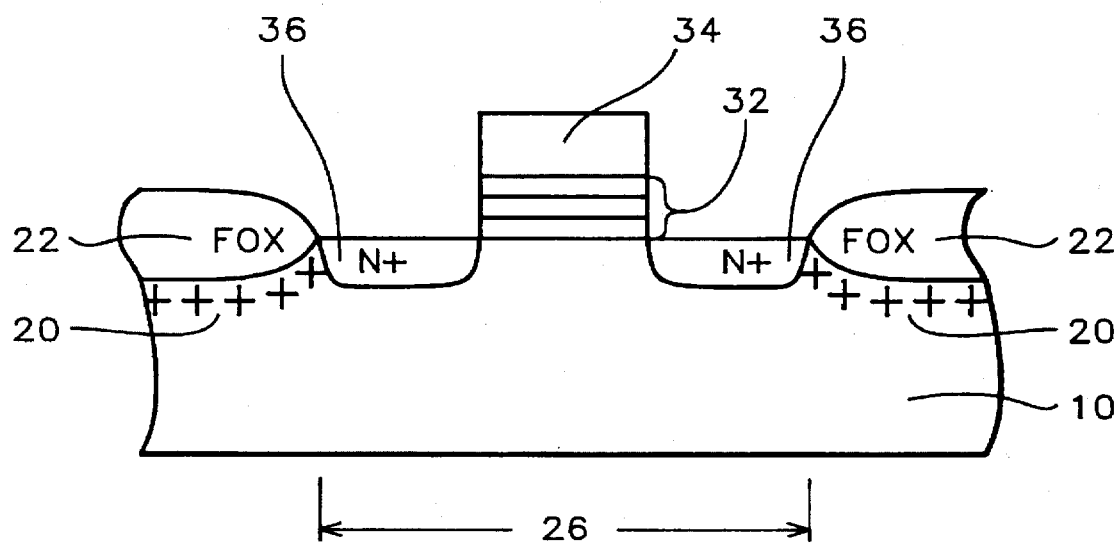

FIG. 7 illustrates a top view of the integrated circuit. Polysilicon line 34 is shown crossing active area 26. The field oxide regions surround the active area 26. View 8—8 is illustrated in FIG. 8. The surface of the substrate is covered with an insulating layer composed of NO or ONO. An ONO layer 32 is illustrated in FIG. 8. The silicon oxide layers are thermally grown to a thickness of between about 10 to 30 Angstroms for the first layer and a thickness of between about 0 to 60 Angstroms for the third layer. The silicon nitride layer is deposited by CVD to a thickness of between about 50 to 300 Angstroms.

A layer of polysilicon 34 is deposited over the NO or ONO layer 32 by CVD to a thickness of between about 2000 to 6000 Angstroms and doped as is conventional in the art. The polysilicon and insulator layers 34 and 32 are patterned using conventional photolithographic and etching techniques to form gate electrode 34 as shown in FIG. 8. Source and drain regions 36 are formed by conventional ion implantation.

Figure 9:
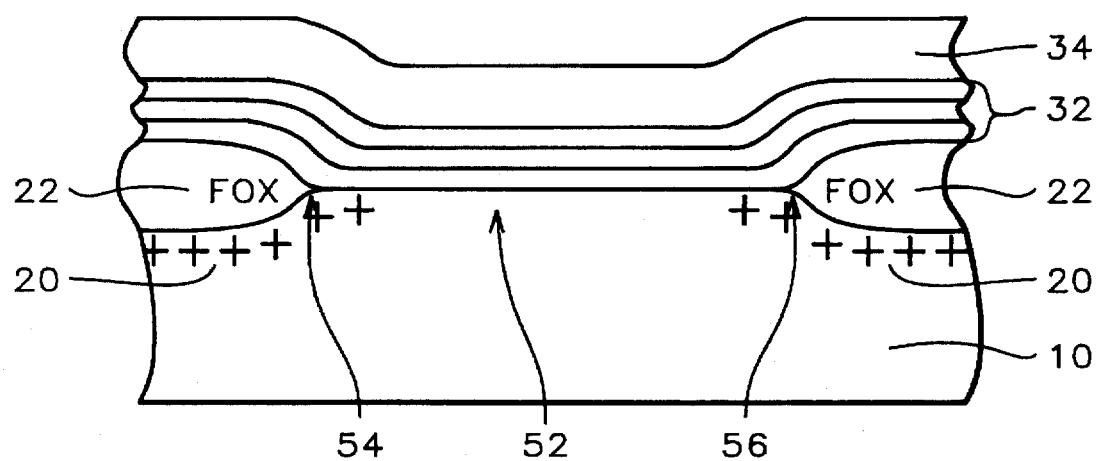

FIG. 9 shows view 9—9 of FIG. 7. The device formed by the process of the invention does not have different threshold voltages across the width of the transistor as in the prior art. The parasitic transistors in the center of the active region 52 and at the FOX edges 54 and 56 have a constant threshold voltage. The presence of the channel stop implants under the entire field oxide region suppresses the off-cell leakage current.

The process of the invention is used in fabricating erasable electrically programmable read-only memory (EEPROM) devices and is especially useful in fabricating MNOS EEPROMS. The device formed by the process of the invention is a MNOS/MONOS EEPROM integrated circuit device as shown in FIGS. 8 and 9 having polysilicon lines over a NO or ONO insulating layer on the surface of the active area of a semiconductor substrate. Source and drain regions are formed within the semiconductor substrate in the active area. Field oxide areas are formed on the perimeter of the active area. Channel-stop implants underlie the entire length of the field oxide regions. This results in a constant threshold voltage across the transistor.

While the invention has been particularly shown and described with reference to the preferred embodiments thereof, it will be understood by those skilled in the art that various changes in form and details may be made without departing from the spirit and scope of the invention.

What is claimed is:

1. The method of forming an MNOS/MONOS FET device with constant threshold voltage, the method comprising:

forming a silicon oxide layer on the surface of a semiconductor substrate;

depositing a layer of silicon nitride over said silicon oxide layer and patterning said silicon nitride layer;

performing ion implantation at a tilt angle to form channel stop regions in said semiconductor substrate not covered by said patterned silicon nitride layer wherein said channel stop regions partially extend underneath said patterned silicon nitride layer;

oxidizing said semiconductor substrate not covered by said patterned silicon nitride layer to form field oxide regions within said semiconductor substrate not covered by said patterned silicon nitride layer to form field oxide regions within said semiconductor substrate wherein each of said field oxide regions has a bird's beak at the portions of said semiconductor substrate underlying edges of said patterned silicon nitride layer and wherein said channel stop regions extend under a full length of said field oxide regions and under said bird's beaks;

removing said patterned silicon nitride layer;

providing an insulating layer over a surface of said semiconductor substrate, said insulating layer including an oxide layer formed on said surface of said semiconductor substrate and a nitride layer formed on said oxide layer;

depositing a layer of polysilicon overlying said insulating layer and patterning said polysilicon layer to define a gate electrode extending over said surface of said semiconductor substrate, over said bird's beaks and over portions of said channel stop regions; and forming source and drain regions within said semiconductor substrate to provide said MNOS/MONOS FET device with a constant threshold voltage.

2. The method of claim 1 wherein the thickness of said silicon oxide layer is between about 200 to 800 Angstroms.

3. The method of claim 1 wherein the thickness of said silicon nitride layer is between about 800 to 2000 Angstroms.

4. The method of claim 1 wherein said ion implantation is done with $B_{11}$ ions at a dosage of between about 1 E 12 to 1 E 14 atoms/cm$^2$ and an energy of between about 10 to 300 KeV at a tilt angle of between about 10° to 70°.

5. The method of claim 1 wherein said ion implantation is done with $BF_2$ ions at a dosage of between about 1 E 12 to 1 E 14 atoms/cm$^2$ and an energy of between about 10 to 300 KeV at a tilt angle of between about 10° to 70°.

6. The method of claim 1 wherein said ion implantation is performed while the wafer containing said silicon substrate is rotated for a symmetrical implantation.

7. The method of claim 1 wherein said insulating layer is composed of a first layer of silicon oxide with a thickness of between about 10 to 30 Angstroms and a second layer of silicon nitride with a thickness of between about 50 to 300 Angstroms.

8. The method of claim 1 wherein said insulating layer is composed of a first layer of silicon oxide with a thickness of between about 10 to 30 Angstroms, a second layer of silicon nitride with a thickness of between about 50 to 300 Angstroms and a third layer of silicon oxide with a thickness of between about 0 to 60 Angstroms.

9. The method of claim 1 wherein said channel stop regions extending under the full length-of said field oxide regions suppress the off-cell leakage current of said device.

10. The method of claim 1 wherein said MNOS/MONOS FET is part of an array of like memory devices that make up an EEPROM.

11. The method of forming an EEPROM device with a constant threshold voltage, the method comprising:

forming a silicon oxide layer on the surface of a semiconductor substrate;

depositing a layer of silicon nitride over said silicon oxide layer and patterning said silicon nitride layer;

performing ion implantation at a tilt angle of between about 10° to 70° to form channel stop regions in said semiconductor substrate not covered by said patterned silicon nitride layer wherein said channel stop regions partially extend underneath said patterned silicon nitride layer;

oxidizing said semiconductor substrate not covered by said patterned silicon nitride layer to form field oxide regions within said semiconductor substrate not covered by said patterned silicon nitride layer to form field oxide regions within said semiconductor substrate wherein each of said field oxide regions has a bird's beak at the portions of said semiconductor substrate underlying edges of said patterned silicon nitride layer and wherein said channel stop regions extend under a full length of said field oxide regions and under said bird's beaks;

removing said patterned silicon nitride layer;

providing an insulating layer over a surface of said semiconductor substrate, said insulating layer including an oxide layer formed on said surface of said semiconductor substrate and a nitride layer formed on said oxide layer;

depositing a layer of polysilicon overlying said insulating layer and patterning said polysilicon layer to define a gate electrode extending over said surface of said semiconductor substrate, over said bird's beaks and over portions of said channel stop regions; and forming source and drain regions within said semiconductor substrate to provide said EEPROM device with a constant threshold voltage over said gate electrode.

12. The method of claim 11 wherein the thickness of said silicon oxide layer is between about 200 to 800 Angstroms.

13. The method of claim 11 wherein the thickness of said silicon nitride layer is between about 800 to 2000 Angstroms.

14. The method of claim 11 wherein said ion implantation is done with $B_{11}$ ions at a dosage of between about 1 E 12 to 1 E 14 atoms/cm$^2$ and an energy of between about 10 to 300 KeV.

15. The method of claim 11 wherein said ion implantation is done with $BF_2$ ions at a dosage of between, about 1 E 12 to 1 E 14 atoms/cm$^2$ and an energy of between about 10 to 300 KeV.

16. The method of claim 11 wherein said ion implantation is performed while the wafer containing said silicon substrate is rotated for a symmetrical implantation.

17. The method of claim 11 wherein said insulating layer is composed of a first layer of silicon oxide with a thickness of between about 10 to 30 Angstroms and a second layer of silicon nitride with a thickness of between about 50 to 300 Angstroms.

18. The method of claim 11 wherein said insulating layer is composed of a first layer of silicon oxide with a thickness of between about 10 to 30 Angstroms, a second layer of silicon nitride with a thickness of between about 50 to 300 Angstroms and a third layer of silicon oxide with a thickness of between about 0 to 60 Angstroms.

* * * * *